(12) United States Patent
Lee et al.

(10) Patent No.: US 11,743,617 B2
(45) Date of Patent: Aug. 29, 2023

(54) IMAGE SENSOR AND ANALOG-TO-DIGITAL CONVERTER

(71) Applicant: SK hynix Inc., Gyeonggi-do (KR)

(72) Inventors: Hoo Chan Lee, Gyeonggi-do (KR);
Min Seok Shin, Gyeonggi-do (KR);
Sung Uk Seo, Gyeonggi-do (KR);
Jeong Eun Song, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 154 days.

(21) Appl. No.: 17/364,187

(22) Filed: Jun. 30, 2021

(65) Prior Publication Data

US 2022/0256107 A1  Aug. 11, 2022

(30) Foreign Application Priority Data

Feb. 8, 2021  (KR) ........................ 10-2021-0017664

(51) Int. Cl.
*H04N 25/75* (2023.01)
*H03M 1/56* (2006.01)
*H04N 25/778* (2023.01)
*G01S 17/894* (2020.01)

(52) U.S. Cl.
CPC ............. *H04N 25/75* (2023.01); *H03M 1/56* (2013.01); *H04N 25/778* (2023.01); *G01S 17/894* (2020.01)

(58) Field of Classification Search
CPC ...................................................... H04N 25/75
USPC ....................................................... 348/300
See application file for complete search history.

(56) References Cited

U.S. PATENT DOCUMENTS 9,723,241 B2    8/2017  Yeh et al.
2016/0309099 A1 * 10/2016 Yeh ...................... H04N 25/617

FOREIGN PATENT DOCUMENTS

KR    10-2019-0020408    3/2019

\* cited by examiner

*Primary Examiner* — Joel W Fosselman
(74) *Attorney, Agent, or Firm* — IP & T GROUP LLP

(57) ABSTRACT

An image sensor includes: a pixel of a first tab; a pixel of a second tab; an operation amplifier suitable for comparing, in a comparison operation, a pixel signal of the first tab and a pixel signal of the second tab with each other to produce a comparison result, receiving, in an auto-zeroing operation, a ramp voltage and a selected pixel signal which is selected based on the comparison result between the pixel signal of the first tab and the pixel signal of the second tab, and receiving, in an analog-to-digital conversion operation, the ramp voltage and an unselected pixel signal which is not selected from the pixel signal of the first tab and the second pixel signal of the second tab; and a counter circuit suitable for generating a digital code based on an output of the operation amplifier.

20 Claims, 3 Drawing Sheets

IMAGE SENSOR AND ANALOG-TO-DIGITAL CONVERTER

CROSS-REFERENCE TO RELATED APPLICATIONS

The present application claims priority of Korean Patent Application No. 10-2021-0017664, filed on Feb. 8, 2021, which is incorporated herein by reference in its entirety.

BACKGROUND

1. Field

Exemplary embodiments of the present invention relate to an image sensor.

2. Description of the Related Art

Recently, an image sensor that provides a three-dimensional (3D) distance image by simultaneously measuring a certain range of distances is being developed. Acquiring such distance image is based on Time-of-Flight (TOF) technology. According to the technology, distances may be measured by irradiating light from a light source near an image sensor and measuring the time taken for the light to be reflected off an object and return.

The TOF technology is largely divided into two methods. One is a direct method and the other is an indirect method. The direct method is to irradiate pulse-type light, measure the time taken for receiving the reflected light, and convert the measured time into distance. In the direct method, precision may be improved by making the pulse width as small as possible in consideration of the luminous flux. Also, the direct method requires very precise time measurement.

Meanwhile, the indirect method does not directly measure the TOF, but the indirect method irradiates an object with modulated light, measures the phase difference with the reflected light, and extracts the distance. To be specific, according to the indirect method, the distance to an object may be measured by detecting the reflected light with a pixel of a tab A and a pixel of a tab B that are activated at different times, and obtaining the difference between a value obtained by analog-to-digital converting a pixel signal of the tab A and a value obtained by analog-to-digital converting a pixel signal of the tab B.

Since the indirect method of TOF requires an analog-to-digital converter for analog-to-digital converting the pixel signal of the tab A and an analog-to-digital converter for analog-to-digital converting the pixel signal of the B tab, burden may be increased in terms of area.

SUMMARY

Embodiments of the present invention are directed to an image sensor in which an area of the image sensor may be reduced by analog-to-digital converting the voltage difference between the pixel signals of two tabs.

In accordance with one embodiment of the present invention, an image sensor includes: a pixel of a first tab; a pixel of a second tab; an operation amplifier suitable for comparing, in a comparison operation, a pixel signal of the first tab and a pixel signal of the second tab with each other to produce a comparison result, receiving, in an auto-zeroing operation, a ramp voltage and a selected pixel signal which is selected based on the comparison result between the pixel signal of the first tab and the pixel signal of the second tab, and receiving, in an analog-to-digital conversion operation, the ramp voltage and an unselected pixel signal which is not selected from the pixel signal of the first tab and the second pixel signal of the second tab; and a counter circuit suitable for generating a digital code based on an output of the operation amplifier.

In accordance with another embodiment of the present invention, a method for operating an image sensor includes: comparing a level of a pixel signal of a first tab and a level of a pixel signal of a second tab with each other; performing an auto-zeroing operation of an operation amplifier based on a ramp voltage and a pixel signal which is selected as a result of the comparing of the level of the pixel signal of the first tab and the level of the pixel signal of the second tab with each other; performing a comparison operation including comparing an unselected pixel signal of the pixel signal of the first tab and the pixel signal of the second tab, with the ramp voltage; and generating a digital code based on a result of the performing of the comparison operation.

In accordance with yet another embodiment of the present invention, an analog-to-digital converter includes: an operation amplifier suitable for comparing, in a comparison operation, a first voltage and a second voltage with each other to produce a comparison result, receiving, in an auto-zeroing operation, a ramp voltage and a selected voltage which is selected as a result of the comparison result between the first voltage and the second voltage, and receiving, in an analog-to-digital conversion operation, the ramp voltage and an unselected voltage which is not selected between the first voltage and the second voltage; and a counter circuit suitable for generating a digital code based on an output of the operation amplifier.

DETAILED DESCRIPTION

Figure 1:
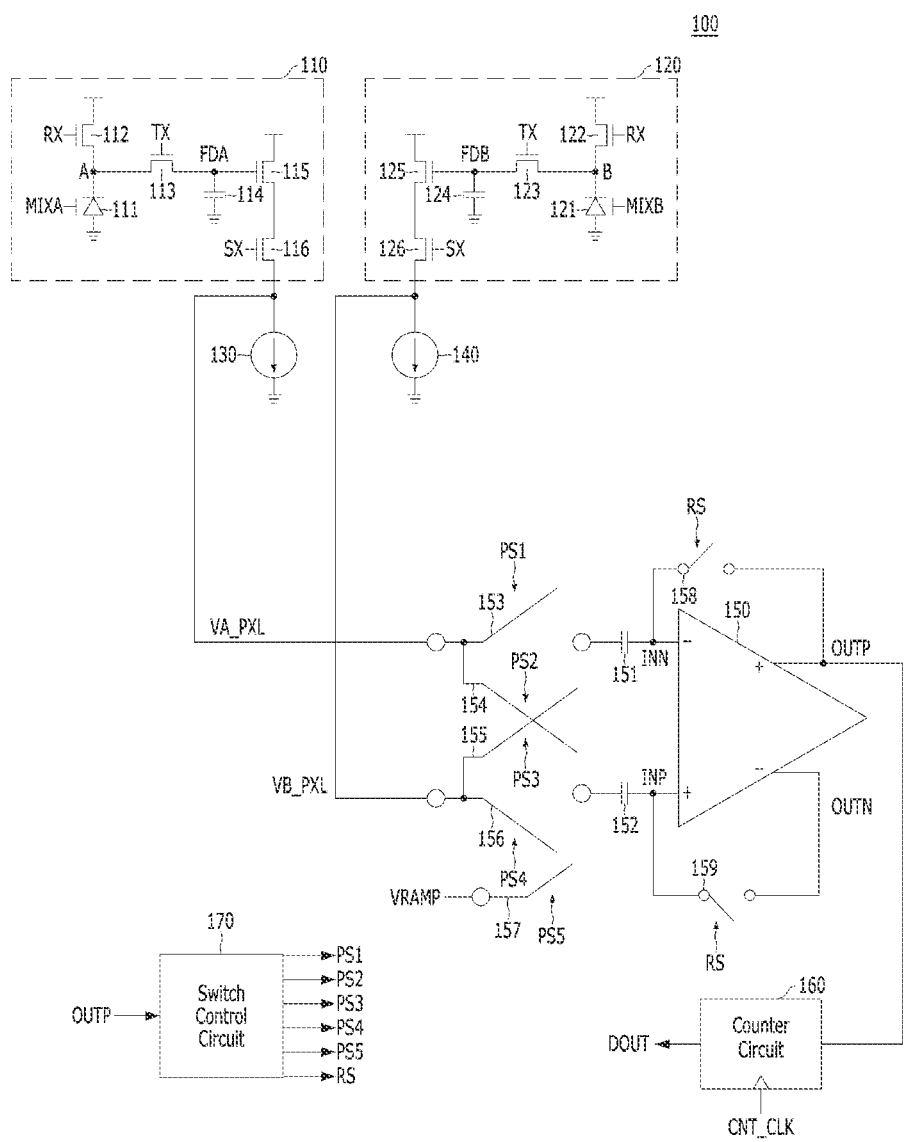
FIG. 1 is a block diagram illustrating an image sensor 100 in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

FIG. 1 is a block diagram illustrating an image sensor 100 in accordance with an embodiment of the present invention.

Referring to FIG. 1, the image sensor 100 may include a pixel 110 of a first tab, a pixel 120 of a second tab, a first pixel signal output unit 130, a second pixel signal output unit 140, an operation amplifier 150, capacitors 151 and 152, switches 153 to 159, a counter circuit 160, and a switch control circuit 170.

The pixel 110 of the first tab may detect light in a section where a signal MIXA is activated. The pixel 110 of the first tab may include a first photo detector 111, a first reset transistor 112, a first transfer transistor 113, a first capacitor 114, a first driving transistor 115, and a first selecting transistor 116. The first photo detector 111 may perform a photoelectric conversion function. The first photo detector 111 may be realized by using at least one of a photo diode, a photo transistor, a photo gate, a pinned photo diode, and a combination thereof. The first photo detector 111 may be activated in a section where a signal is activated to a high level under the control of the signal MIXA. The first reset transistor 112 may transfer a power source voltage to a node A in response to a reset signal RX. The first transfer transistor 113 may electrically connect the node A and a first floating diffusion node FDA to each other in response to a transfer signal TX. The first floating diffusion node FDA may be a node in which charges corresponding to the light detected by the first photo detector 111 or charges corresponding to an initialization voltage are accumulated. The first capacitor 114 may be coupled to the first floating diffusion node FDA. The first driving transistor 115 may include a gate coupled to the first floating diffusion node FDA, and include a drain and a source coupled between a power source voltage terminal and the first selecting transistor 116. The first driving transistor 115 may amplify the voltage of the first floating diffusion node FDA. The first selecting transistor 116 may transfer the current transferred from the first driving transistor 116 to a node which outputs a pixel signal VA_PXL of the first tab associated with pixel 110 in response to a selection signal SX.

The pixel 120 of the second tab may detect light in a section where the signal MIXB is activated. The signal MIXA and the signal MIXB may be periodic waves having the same frequency but having different phases. The pixel 120 of the second tab may include a second photo detector 121, a second reset transistor 122, a second transfer transistor 123, a second capacitor 124, a second driving transistor 125, and a second selecting transistor 126. The second photo detector 121 may perform a photoelectric conversion function. The second photo detector 121 may be implemented by using at least one of a photo diode, a photo transistor, a photo gate, a pinned photo diode, and a combination thereof. The second photo detector 121 may be activated in a section where a signal is activated to a high level under the control of the signal MIXB. The second reset transistor 122 may transfer a power source voltage to a node B in response to the reset signal RX. The second transfer transistor 123 may electrically connect the node B and the second floating diffusion node FDB to each other in response to the transfer signal TX. The second floating diffusion node FDB may be a node in which charges corresponding to the light detected by the second photo detector 121 or charges corresponding to an initialization voltage are accumulated. The second capacitor 124 may be coupled to the second floating diffusion node FDB. The second driving transistor 125 may include a gate coupled to the second floating diffusion node FDB and a drain and a source coupled between the power source voltage terminal and the second selecting transistor 126. The second driving transistor 125 may amplify the voltage of the second floating diffusion node FDB. The second selecting transistor 126 may transfer the current transferred from the second driving transistor 126 in response to the selection signal SX to a node to which the pixel signal VB_PXL of the second tab associated with pixel 120 is output.

The first pixel signal output unit 130 may sink a constant current from a node to which the pixel signal VA_PXL of the first tab is output. The voltage level of the pixel signal VA_PXL of the first tab may be determined by the amount of current sourced from the first selecting transistor 116 and the amount of current sinked by the first pixel signal output unit 130. The sinking current amount of the first pixel signal output unit 130 may be a constant, and the sourcing current amount of the first selecting transistor 116 may increase as the voltage level of the first floating diffusion node FDA increases. In one embodiment, the voltage level of the pixel signal VA_PXL of the first tab may increase as the voltage level of the first floating diffusion node FDA increases. The first pixel signal output unit 130 may include a current source.

The second pixel signal output unit 140 may sink a constant current from the node to which the pixel signal VB_PXL of the second tab is output. The voltage level of the pixel signal VB_PXL of the second tab is determined by the amount of current sourced from the second selecting transistor 126 and the amount of current sinked by the second pixel signal output unit 140. The sinking current amount of the second pixel signal output unit 140 may be a constant, and the sourcing current amount of the second selecting transistor 126 may increase as the voltage level of the second floating diffusion node FDB increases. In one embodiment, the voltage level of the pixel signal VB_PXL of the second tab may increase as the voltage level of the second floating diffusion node FDB increases. The second pixel signal output unit 140 may include a current source.

The operation amplifier 150 may receive signals selected by the switches 153 to 157 from one or more of the pixel signal VA_PXL of the first tab, the pixel signal VB_PXL of the second tab, and the ramp voltage VRAMP at the input terminals INN and INP through the capacitors 151 and 152. When the voltage level of the input terminal INP of one of input terminals INN and INP is high, the operation amplifier 150 may generate an output signal OUTP at a high level, and when the voltage level of the input terminal INN of one of input terminals INN and INP is high, the operation amplifier 150 may generate the output signal OUTP at a low level. When the switches 158 and 159 are turned on, the input terminal INN and the output terminal OUTP of the operation amplifier 150 may be short-circuited, and the input terminal INP and the output terminal OUTN of the operation amplifier 150 may be short-circuited so as to auto-zero the operation amplifier 150. The input terminal INN may be a negative (−) input terminal, and the input terminal INP may be a positive (+) input terminal, and the output terminal OUTP may be a positive (+) output terminal, and the output terminal OUTN may be a negative (−) output terminal. As will be described later, an auto-zeroing operation of the operation amplifier 150 may be performed while a pixel signal having a higher voltage level among the pixel signals VA_PXL and VB_PXL is being applied to the operation amplifier 150, and thereafter, a comparison operation with the ramp voltage VRAMP may be performed while a pixel signal having a lower voltage level of one of pixel signals VA_PXL and VB_PXL is being applied to the operation amplifier 150 so that an analog-to-digital conversion operation may be performed on a voltage corresponding the voltage difference between the two pixel signals VA_PXL and VB_PXL.

The counter circuit 160 may generate a digital code DOUT by counting a counting clock CNT_CLK in response to a signal from the output terminal OUTP of the operation amplifier 150.

The switch control circuit 170 may generate control signals PS1 to PS5 and RS for controlling the switches 153 to 159. The switch control circuit 170 may control the on/off of the switches 153 to 159 by using the control signals PS1 to PS5 and RS. The switch control circuit 170 may use the signal of the output terminal OUTP to generate the control signals PS1 to PS5 and RS.

The operation section of the image sensor 100 may be divided functionally into a comparison operation section, an auto-zeroing operation section, and an analog-to-digital conversion section. Hereinafter, the operations of the image sensor 100 in each operation section will be described.

Figure 2:
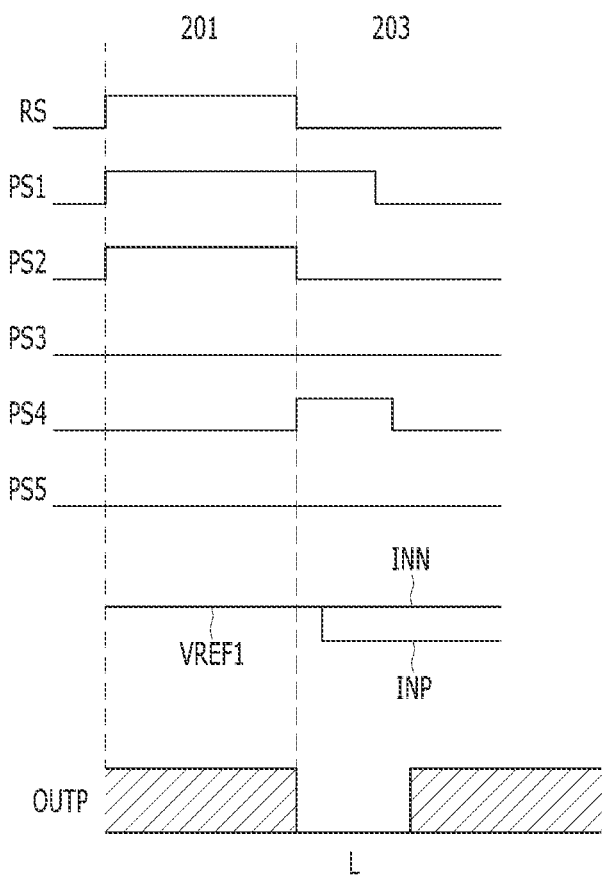
FIG. 2 is a timing diagram illustrating an operation in a comparison operation section of the image sensor 100 shown in FIG. 1.

FIG. 2 is a timing diagram illustrating an operation in the comparison operation section of the image sensor 100 shown in FIG. 1. In the comparison operation section, the voltage levels of the two pixel signals VA_PXL and VB_PXL may be compared with each other using operational amplifier 150.

Referring to FIG. 2, first, during section '201', the switch control circuit 170 may activate the control signals PS1, PS2, and RS to a high level so as to turn on the switches 153, 154, 158, and 159. Since the switches 153 and 154 are turned on, the pixel signal VA_PXL of the first tab may be applied to the input terminals INN and INP through the capacitors 151 and 152. Also, since the switches 158 and 159 are turned on, the input terminal INN and the output terminal OUTP are short-circuited, and the input terminal INP and the output terminal OUTN are short-circuited so that the operation amplifier 150 may be auto-zeroed. The auto-zeroing operation may be able to make the voltage levels of the two input terminals INN and INP of the operation amplifier 150 the same. In FIG. 2, this voltage level is indicated by VREF1. In one embodiment, section '201' may auto-zero the operation amplifier 150 for accurate operation before comparing the voltage levels of the two pixel signals VA_PXL and VB_PXL with each other.

In the section '203' shown in FIG. 2, the switch control circuit 170 may activate the control signals PS1 and PS4 to a high level so as to turn on the switches 153 and 156. In the section '203', since the input terminal INN continues to receive the pixel signal VA_PXL of the first tab through the capacitor 151 as it does in the previous section '201', the voltage level of the input terminal INN may be maintained at the level of VREF1. Meanwhile, since the input terminal INP receives the pixel signal VA_PXL of the first tab in the section '201' and then receives the pixel signal VB_PXL of the second tab in the section '203' through the capacitor 151, the level of the input terminal INP may change. When the voltage level of the pixel signal VB_PXL of the second tab associated with pixel 120 is higher than the voltage level of the pixel signal VA_PXL of the first tab associated with pixel 110, the voltage level of the input terminal INP is higher than VREF1. When the voltage level of the pixel signal VB_PXL of the second tab is lower than the voltage level of the pixel signal VA_PXL of the first tab, the voltage level of the input terminal INP is lower than VREF1. Described herein is an embodiment where the voltage level of the pixel signal VB_PXL of the second tab is lower than the voltage level of the pixel signal VA_PXL of the first tab, and thus the voltage level of the input terminal INP becomes lower than VREF1.

In the section '203' shown in FIG. 2, since the voltage level of the input terminal INP is lower than the voltage level of the input terminal INN, the output signal OUTP is generated at a low level. When the output signal OUTP is at a low level, it may mean that the voltage level of the pixel signal VA_PXL of the first tab is higher than the voltage level of the pixel signal VB_PXL of the second tab. Unlike the example of FIG. 2, when the voltage level of the pixel signal VB_PXL of the second tab is higher than the voltage level of the pixel signal VA_PXL of the first tab, here the output signal OUTP may be generated at a high level. The output signal OUTP may be transferred as a switch control signal, and the switch control circuit 170 may perform a voltage level comparison between the pixel signal VA_PXL of the first tab associated with pixel 110 and the pixel signal VB_PXL of the second tab associated with pixel 120.

The voltage level of the pixel signal VA_PXL of the first tab and the voltage level of the pixel signal VB_PXL of the second tab may be compared with each other by the operation of the above-described comparison operation section, which is described in FIG. 2.

Hereafter, the pixel signal which is determined to have a higher voltage level by the operation of the comparison operation section among the pixel signal VA_PXL of the first tab and the pixel signal VB_PXL of the second tab may be referred to as a selected pixel signal, and the pixel signal which is determined to have a lower voltage level may be referred to as an unselected pixel signal.

Figure 3:
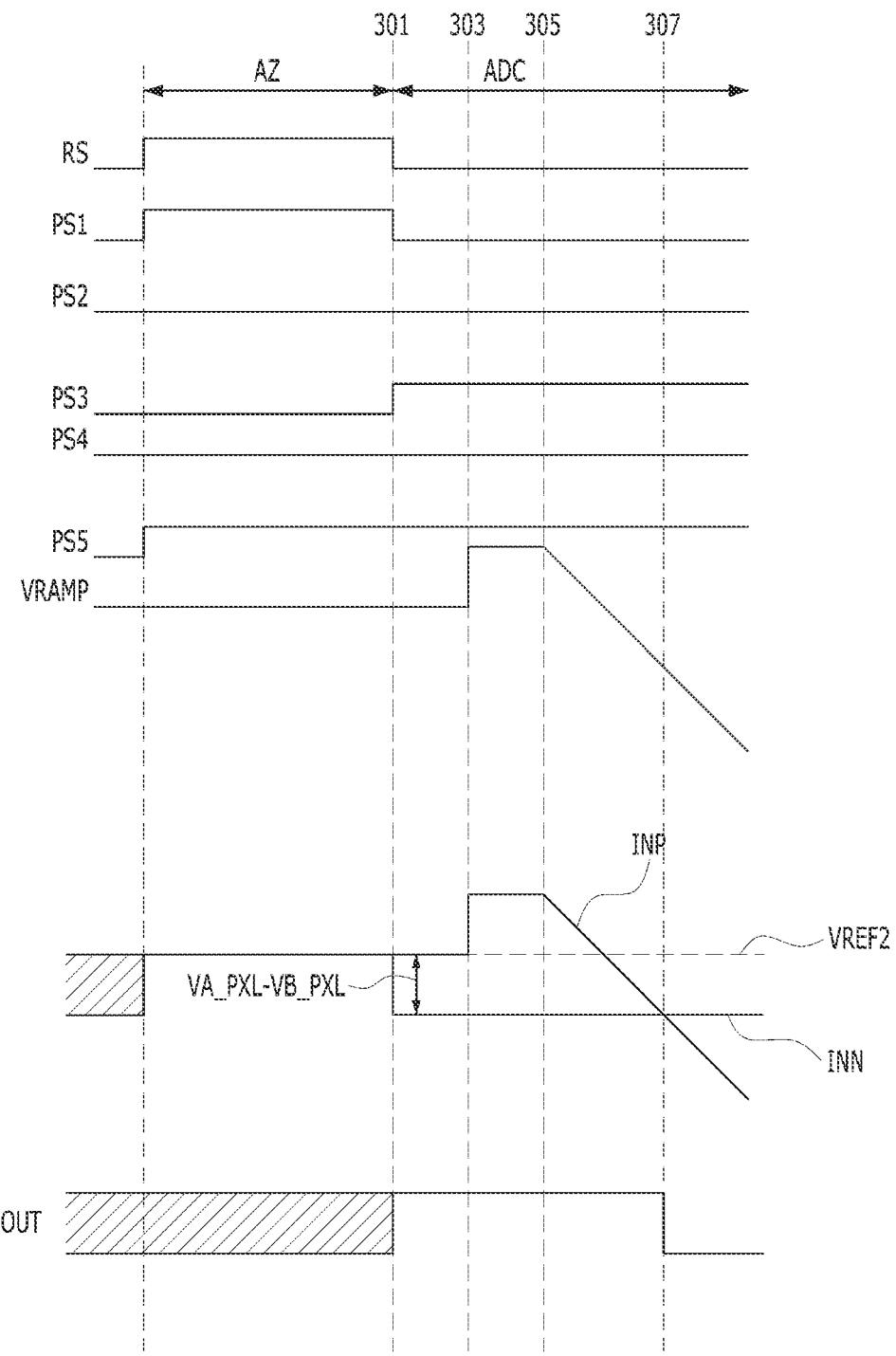
FIG. 3 is a timing diagram illustrating an operation of an auto-zeroing operation section AZ and an operation of an analog-to-digital conversion section ADC of the image sensor 100 shown in FIG. 1.

FIG. 3 is a timing diagram illustrating an operation of an auto-zeroing operation section AZ and an operation of an analog-to-digital conversion section ADC of the image sensor 100 shown in FIG. 1. The operations of the auto-zeroing operation section AZ and the analog-to-digital conversion section ADC illustrated in FIG. 3 may be performed using operational amplifier 150 after the operation of the comparison operation section of FIG. 2.

In FIG. 3, it may be assumed that the pixel signal VA_PXL of the first tab becomes a selected pixel signal and the pixel signal VB_PXL of the second tab becomes an unselected pixel signal as a result of the operation of the comparison operation section shown in FIG. 2. In other words, it may be assumed that the voltage level of the pixel signal VA_PXL of the first tab is higher than the voltage level of the pixel signal VB_PXL of the second tab.

In the auto-zeroing operation section AZ, the operation amplifier 150 may be auto-zeroed while the selected pixel signal VA_PXL and the ramp voltage VRAMP are being applied to the operation amplifier 150. In the auto-zeroing operation section AZ, the switch control circuit 170 may activate the control signals PS1, PS5, and RS to a high level so as to turn on the switches 153, 157, 158, and 159. As the switch 153 is turned on, the selected pixel signal VA_PXL may be applied to the input terminal INN through the capacitor 151, and as the switch 157 is turned on, the ramp voltage VRAMP may be applied to the input terminal INP through the capacitor 152. Also, as the switches 158 and 159 are turned on, the input terminal INN and the output terminal OUTP are short-circuited, and the input terminal INP and the output terminal OUTN are short-circuited, and thus the operation amplifier 150 may be auto-zeroed. The auto-zeroing operation may make the voltage levels of the two input terminals INN and INP of the operation amplifier 150 the same. In FIG. 3, this voltage level is indicated by VREF2.

In the analog-to-digital conversion section ADC, an analog-to-digital conversion operation may be performed while an unselected pixel signal VB_PXL and the ramp voltage VRAMP are applied to the operation amplifier 150. In this section, an analog voltage corresponding to the voltage difference between the pixel signal VA_PXL of the first tab and the pixel signal VB_PXL of the second tab may be converted into a digital code DOUT.

At a moment 301 shown in FIG. 3, the control signal PS1 may be deactivated and the control signal PS3 may be activated. This may turn on the switch 155 to apply the unselected pixel signal VB_PXL to the input terminal INN through the capacitor 151. Since the voltage level at one end of the capacitor 151 is changed from VA_PXL to VB_PXL, that is, since the voltage level is dropped by (VA_PXL−VB_PXL), the voltage level of the input terminal INN at the other end of the capacitor 151 may drop as much as (VA_PXL−VB_PXL). In one embodiment, the voltage level of the input terminal INN may be VREF2−(VA_PXL−VB_PXL).

From a moment 303, a ramping operation in which the level of the ramp voltage VRAMP rises and then falls may be performed. Accordingly, the voltage level of the input terminal INP may rise and then fall in the same form as the ramp voltage VRAMP. From a moment 305 when the voltage level of the input terminal INP starts to fall to a moment 307 when the voltage of the input terminal INP becomes equal to the input terminal INN, that is, the output signal OUTP of the operation amplifier 150 transitions from high to low, the counter circuit 160 may generate a digital code DOUT by counting the number of times that the counting clock CNT_CLK is activated. The digital code DOUT may be a value obtained by analog-to-digital converting the value of (VA_PXL−VB_PXL).

In one embodiment as shown in FIG. 3, an auto-zeroing operation of the operation amplifier 150 may be performed based on the selected pixel signal, which is a pixel signal having a higher voltage level among the pixel signal VA_PXL of the first tab and the pixel signal VB_PXL of the second tab. By performing an analog-to-digital conversion operation while a pixel signal having a lower voltage level among the pixel signal VA_PXL of the first tab and the pixel signal VB_PXL of the second tab is applied to the operation amplifier 150, a value corresponding to the voltage difference between the two pixel signals VA_PXL and VB_PXL may be analog-to-digital converted by the single analog-to-digital conversion operation so as to produce a digital code DOUT. With the digital code DOUT, it may be possible to measure distance. In some methods which have been proposed, a digital code corresponding the voltage difference between two pixels may be generated by analog-to-digital converting the voltages of the two pixels by using two analog-to-digital converters so as to produce two digital codes in order to analog-to-digital convert the voltage difference between the two pixels, and calculating the two digital codes. Various embodiments of the present invention can make it possible to analog-to-digital convert the voltage difference between two pixels all at once by using one analog-to-digital converter.

FIG. 3 illustrates an example where the selected pixel signal is the pixel signal VA_PXL of the first tab. However, when the selected pixel signal is the pixel signal VB_PXL of the second tab, the switch control circuit 170 may activate the control signal PS3 instead of the control signal PS1 to a high level in the auto-zeroing operation section AZ and activate the control signal PS1 instead of the control signal PS3 to a high level in the analog-to-digital conversion section ADC. In this example, the operation amplifier 150 may be auto-zeroed while the pixel signal VB_PXL of the second tab and the ramp voltage VRAMP are being applied to the operation amplifier 150, and an analog-to-digital conversion operation may be performed while the pixel signal of the first tab and the ramp voltage are being applied to the operation amplifier 150 so that the difference between the two voltages (VB_PXL−VA_PXL) may be converted into a digital code DOUT.

In the image sensor 100 of FIG. 1, the constituent elements except for the constituent elements 110, 120, 130, and 140 related to the pixel are elements for converting an analog voltage output from the pixel into a digital code. For this reason, the technology of the present invention may be applied not only to image sensors but also to general analog-to-digital conversion circuits for converting an analog voltage into a digital code. In particular, the technology of the present invention may be used for analog-to-digital conversion of the difference between two voltages.

According to various embodiments of the present invention, the voltage difference between the pixel signals of two tabs may be analog-to-digital converted.

While the present invention has been described with respect to the specific embodiments, it will be apparent to those skilled in the art that various changes and modifications may be made without departing from the spirit and scope of the invention as defined in the following claims.

What is claimed is:

1. An image sensor comprising:
   a pixel of a first tab;
   a pixel of a second tab;
   an operation amplifier suitable for comparing, in a comparison operation, a pixel signal of the first tab and a pixel signal of the second tab with each other to produce a comparison result, receiving, in an auto-zeroing operation, a ramp voltage and a selected pixel signal which is selected based on the comparison result between the pixel signal of the first tab and the pixel signal of the second tab, and receiving, in an analog-to-digital conversion operation, the ramp voltage and an unselected pixel signal which is not selected from the pixel signal of the first tab and the second pixel signal of the second tab; and
   a counter circuit suitable for generating a digital code based on an output of the operation amplifier,
   wherein in the comparison operation of the operational amplifier,
   the operation amplifier is suitable to be auto-zeroed while the pixel signal of the first tab is applied to a positive input terminal and a negative input terminal of the operation amplifier.

2. The image sensor of claim 1, wherein in the comparison operation of the operational amplifier,
   after the operation amplifier is auto-zeroed, as the pixel signal of the first tab is applied to the negative input terminal and the pixel signal of the second tab is applied to the positive input terminal, a voltage level of the pixel signal of the first tab and a voltage level of the pixel signal of the second tab are suitable to be compared with each other.

3. The image sensor of claim 1, wherein in the auto-zeroing operation of the operational amplifier,
   the operation amplifier is suitable to be auto-zeroed while both a) the selected pixel signal is applied to a negative input terminal of the operation amplifier and b) the ramp voltage is applied to a positive input terminal of the operation amplifier.

4. The image sensor of claim 1, wherein in the analog-to-digital conversion operation of the operational amplifier,
the unselected pixel signal is suitable to be applied to a negative input terminal of the operation amplifier, and
the ramp voltage is suitable to be applied to a positive input terminal of the operation amplifier.

5. The image sensor of claim 4, wherein a ramping operation in which a voltage level of the ramp voltage is changed, is suitable to be performed in the analog-to-digital conversion operation of the operational amplifier.

6. The image sensor of claim 1, wherein the pixel of the first tab and the pixel of the second tab are suitable to be exposed in different temporal sections of the image sensor.

7. The image sensor of claim 1, wherein the operation amplifier is suitable to receive voltages through a first capacitor coupled to a negative input terminal and a second capacitor coupled to a positive input terminal.

8. The image sensor of claim 1, wherein the pixel of the first tab includes:
a first photo detector coupled to a first node;
a first reset transistor suitable for resetting the first node in response to a reset signal;
a first transfer transistor suitable for electrically connecting the first node and the first floating diffusion node to each other in response to a transfer signal;
a first capacitor coupled to the first floating diffusion node;
a first driving transistor suitable for amplifying a voltage of the first floating diffusion node; and
a first selecting transistor suitable for outputting the voltage amplified by the first driving transistor to a first tab output line in response to a first selection signal.

9. The image sensor of claim 8, wherein the pixel of the second tab includes:
a second photo detector coupled to a second node;
a second reset transistor suitable for resetting the second node in response to a reset signal;
a second transfer transistor suitable for electrically connecting the second node and the second floating diffusion node to each other in response to a transfer signal;
a second capacitor coupled to the second floating diffusion node;
a second driving transistor suitable for amplifying a voltage of the second floating diffusion node; and
a second selecting transistor suitable for outputting the voltage amplified by the second driving transistor to a second tab output line in response to a second selection signal.

10. The image sensor of claim 1, further comprising:
a plurality of switches suitable for selectively applying the pixel signal of the first tab, the pixel signal of the second tab, and the ramp voltage to a positive input terminal and a negative input terminal of the operation amplifier.

11. A method for operating an image sensor, comprising:
comparing a level of a pixel signal of a first tab and a level of a pixel signal of a second tab with each other;
performing an auto-zeroing operation of an operation amplifier based on a ramp voltage and a pixel signal which is selected as a result of the comparing of the level of the pixel signal of the first tab and the level of the pixel signal of the second tab with each other;
performing a comparison operation including comparing an unselected pixel signal of the pixel signal of the first tab and the pixel signal of the second tab, with the ramp voltage; and
generating a digital code based on a result of the performing of the comparison operation,
wherein in the comparing of the level of the pixel signal of the first tab and the level of the pixel signal of the second tab with each other,
the operation amplifier is suitable to be auto-zeroed while the pixel signal of the first tab is applied to a positive input terminal and a negative input terminal of the operation amplifier.

12. The method of claim 11, wherein in the comparing of the level of the pixel signal of the first tab and the level of the pixel signal of the second tab with each other,
after the operation amplifier is auto-zeroed, a voltage level of the pixel signal of the first tab and a voltage level of the pixel signal of the second tab are suitable to be compared with each other, as the pixel signal of the first tab is applied to the negative input terminal and the pixel signal of the second tab is applied to the positive input terminal.

13. The method of claim 11, wherein in the performing of the auto-zeroing operation of the operation amplifier,
the operation amplifier is suitable to be auto-zeroed while both a) the selected pixel signal is applied to a negative input terminal of the operation amplifier and b) the ramp voltage is applied to a positive input terminal of the operation amplifier.

14. The method of claim 11, wherein in the performing of the comparison operation,
the unselected pixel signal is suitable to be applied to a negative input terminal of the operation amplifier, and
the ramp voltage is suitable to be applied to a positive input terminal of the operation amplifier.

15. The method of claim 14, wherein in the performing of the comparison operation,
a ramping operation in which a voltage level of the ramp voltage is changed, is suitable to be performed.

16. An analog-to-digital converter, comprising:
an operation amplifier suitable for comparing, in a comparison operation, a first voltage and a second voltage with each other to produce a comparison result, receiving, in an auto-zeroing operation, a ramp voltage and a selected voltage which is selected as a result of the comparison result between the first voltage and the second voltage, and receiving, in an analog-to-digital conversion operation, the ramp voltage and an unselected voltage which is not selected between the first voltage and the second voltage; and
a counter circuit suitable for generating a digital code based on an output of the operation amplifier,
wherein in the comparison operation of the operation amplifier,
the operation amplifier is suitable to be auto-zeroed while the first voltage is applied to a positive input terminal and a negative input terminal of the operation amplifier.

17. The analog-to-digital converter of claim 16, wherein in the comparison operation of the operation amplifier,
after the operation amplifier is auto-zeroed, a voltage level of the first voltage and a voltage level of the second voltage are suitable to be compared with each other, as the first voltage is applied to the negative input terminal and the second voltage is applied to the positive input terminal.

18. The analog-to-digital converter of claim 16, wherein in the auto-zeroing operation of the operation amplifier,
the operation amplifier is suitable to be auto-zeroed while both a) the selected voltage is applied to a negative input terminal of the operation amplifier and b) the ramp voltage is applied to a positive input terminal of the operation amplifier.

19. The analog-to-digital converter of claim 16, wherein in the analog-to-digital conversion operation of the operation amplifier, the unselected voltage is suitable to be applied to a negative input terminal of the operation amplifier, and the ramp voltage is suitable to be applied to a positive input terminal of the operation amplifier.

20. The analog-to-digital converter of claim 19, wherein in the analog-to-digital conversion operation of the operation amplifier, a ramping operation in which a voltage level of the ramp voltage is changed, is suitable to be performed.

* * * * *